(12) United States Patent
Uesugi et al.

(10) Patent No.: US 8,299,498 B2
(45) Date of Patent: Oct. 30, 2012

(54) SEMICONDUCTOR DEVICE HAVING HETERO JUNCTION

(75) Inventors: Tsutomu Uesugi, Seto (JP); Kenji Ito, Nagoya (JP); Osamu Ishiguro, Nagoya (JP); Tetsu Kachi, Nissin (JP); Masahiro Sugimoto, Toyota (JP)

(73) Assignees: Kabushiki Kaisha Toyota Chuo Kenkyusho, Aichi-gun (JP); Toyota Jidosha Kabushiki Kaisha, Toyota-shi (JP)

( * ) Notice: Subject to any disclaimer, the term of this patent is extended or adjusted under 35 U.S.C. 154(b) by 595 days.

(21) Appl. No.: 12/595,253

(22) PCT Filed: Apr. 7, 2008

(86) PCT No.: PCT/JP2008/056869
§ 371 (c)(1), (2), (4) Date: Oct. 9, 2009

(87) PCT Pub. No.: WO2008/126821
PCT Pub. Date: Oct. 23, 2008

(65) Prior Publication Data
US 2010/0117119 A1 May 13, 2010

(30) Foreign Application Priority Data
Apr. 9, 2007 (JP) .................................. 2007-101346

(51) Int. Cl.
*H01L 29/66* (2006.01)
(52) U.S. Cl. ................................ 257/194; 257/E29.246
(58) Field of Classification Search .................... 257/194
See application file for complete search history.

(56) References Cited

U.S. PATENT DOCUMENTS

| | | | |
|---|---|---|---|
| 7,211,839 | B2 | 5/2007 | Kachi et al. |
| 2004/0157355 | A1 | 8/2004 | Kachi et al. |
| 2006/0065912 | A1 | 3/2006 | Beach |
| 2006/0175618 | A1 | 8/2006 | Ishida |
| 2006/0220156 | A1* | 10/2006 | Saito et al. ............... 257/409 |

(Continued)

FOREIGN PATENT DOCUMENTS
JP 6 163928 6/1994
(Continued)

OTHER PUBLICATIONS

Kuroda, M. et al., "Normally-Off Operation of AlGaN/GaN Heterojunction Field Effect Transistors on Non-Polar (11-20) Plane", IEICE Technical Report, ED2005-205, MW2005-159, pp. 35-39 (Jan. 2006) (with English abstract).

(Continued)

*Primary Examiner* — Zandra Smith
*Assistant Examiner* — Igwe U Anya
(74) *Attorney, Agent, or Firm* — Oblon, Spivak, McClelland, Maier & Neustadt, L.L.P.

(57) ABSTRACT

A semiconductor device 10 is provided with a first hetero junction 40b configured with two types of nitride semiconductors having different bandgap energy from each other, a second hetero junction 50b configured with two types of nitride semiconductors having different bandgap energy from each other, and a gate electrode 58 facing the second hetero junction 50b. The second hetero junction 50b is configured to be electrically connected to the first hetero junction 40b. The first hetero junction 40b is a c-plane and the second hetero junction 50b is either an a-plane or an m-plane.

18 Claims, 12 Drawing Sheets

U.S. PATENT DOCUMENTS

| | | | |
|---|---|---|---|
| 2007/0018243 A1* | 1/2007 | Ono et al. | 257/330 |
| 2007/0040217 A1* | 2/2007 | Saito et al. | 257/341 |
| 2007/0108512 A1* | 5/2007 | Sedlmaier et al. | 257/328 |
| 2007/0187695 A1* | 8/2007 | Nakamura et al. | 257/77 |
| 2007/0228462 A1* | 10/2007 | Saito | 257/341 |
| 2007/0267664 A1* | 11/2007 | Sumi et al. | 257/288 |
| 2008/0121927 A1* | 5/2008 | Matocha et al. | 257/183 |
| 2008/0128862 A1* | 6/2008 | Sugimoto et al. | 257/615 |
| 2008/0174671 A1* | 7/2008 | Tanaka et al. | 348/222.1 |
| 2008/0246084 A1* | 10/2008 | Ono et al. | 257/341 |
| 2008/0246085 A1* | 10/2008 | Saito et al. | 257/342 |

FOREIGN PATENT DOCUMENTS

| | | |
|---|---|---|
| JP | 2002 198516 | 7/2002 |
| JP | 2004 260140 | 9/2004 |
| JP | 2004 335960 | 11/2004 |
| JP | 2006 100820 | 4/2006 |
| JP | 2006 245564 | 9/2006 |
| JP | 2006 286698 | 10/2006 |
| JP | 2008 4720 | 1/2008 |

OTHER PUBLICATIONS

Japanese Office Action issued Dec. 13, 2011 in patent application No. 2007-101346 with English translation.

* cited by examiner

SEMICONDUCTOR DEVICE HAVING HETERO JUNCTION

FIELD OF THE INVENTION

This application claims priority to Japanese Patent Application No. 2007-101346, filed on Apr. 9, 2007, the contents of which are hereby incorporated by reference into this specification.

The present invention relates to a semiconductor device having a hetero junction.

BACKGROUND OF THE INVENTION

A nitride semiconductor has a high electric breakdown field and a high electron saturation velocity. Thus, the nitride semiconductor is expected to be a semiconductor material for semiconductor devices having a high breakdown voltage and a low on-state resistance. Many of the conventional semiconductor devices using the nitride related materials may have hetero junctions. The hetero junction is configured with two types of nitride semiconductors having different bandgap energy from each other and is able to generate a two-dimensional electron gas layer (2DEG layer) near the junction plane. The semiconductor devices having the hetero junction may achieve a low on-state resistance by passing an electric current through this 2DEG layer. This type of semiconductor devices is called a HEMT (High Electron Mobility Transistor).

This type of conventional semiconductor devices has a gate portion for switching the electric current. The gate portion has a hetero junction and a gate electrode that faces the hetero junction.

Generally, the hetero junction is formed at a c-plane of a semiconductor crystal. The c-plane has a strong internal electric field due to its spontaneous polarization and piezoelectric polarization. Therefore, electrons are able to stay near the hetero junction plane in high density. Thus, a 2DEG layer may be generated near the hetero junction plane with high density. This type of conventional semiconductor devices utilizes the 2DEG layer generated near the hetero junction plane as a channel, and as a result, achieves a low on-state resistance. However, this type of conventional semiconductor devices needs to apply a negative voltage to the gate electrode in order to eliminate the 2DEG layer. That is, this type of conventional semiconductor devices operates in a normally-on mode.

The document 1 listed below discloses a semiconductor device which operates in a normally-off mode. The gate portion of the semiconductor device described in the document 1 utilizes the hetero junction formed at an a-plane. The a-plane is a crystal plane that extends in a direction perpendicular to the c-plane. Thus, due to the spontaneous polarization and the piezoelectric polarization of the a-plane, the direction of the internal electric field therein is parallel to the hetero junction. Therefore, the a-plane has a characteristic feature of non-polarity. By utilizing this technique, the electron density near the hetero junction may be decreased and semiconductor devices may operate with the normally-off mode.

(Document 1): Masayuki Kuroda, Hidetoshi ISHIDA, Tetsuzo Ueda, and Tsuyoshi Tanaka, "Normally-off Operation of AlGaN/GaN Heterojunction Field Effect Transistors on Non-polar (11-20) plane", IEICE (THE INSTITUTE OF ELECTRONICS, INFORMATION AND COMMUNICATION ENGINEERS) Technical Report, ED2005-205, MW2005-159(2006-1), pp. 35-39

DISCLOSURE OF INVENTION

Problem to be Solved by the Invention

The semiconductor device disclosed in the document 1 is a horizontal type semiconductor device in which both of the drain and the source are disposed on a surface of the semiconductor substrate. The hetero junction extends along with the horizontal direction thereacross between the drain and the source. According to the semiconductor device in the document 1, configuring the distance between the drain and the source longer may contribute in raising the breakdown voltage between the drain and the source. Accordingly, in such a case, the elongated distance between the drain and the source may cause the hetero junction to be elongated. Furthermore, according to the semiconductor device in the document 1, the electron density near the hetero junction may be small because the hetero junction may be formed at the a-plane. Thus, the on-state resistance of the semiconductor device disclosed in the document 1 may increase when the length of the hetero junction is elongated to achieve a high breakdown voltage. In contrast, the breakdown voltage of the semiconductor device disclosed in the document 1 may decrease when the length of the hetero junction is shortened to achieve a low on-state resistance.

The object of the present invention is to provide a semiconductor device that operates with a normally-off mode and has a high breakdown voltage as well as a low on-state resistance.

Means to Solve the Problem

A teaching disclosed by the present application is to utilize at least two hetero junctions. One of the hetero junctions is formed at a c-plane and the other is formed at either an a-plane or an m-plane. The hetero junction at the c-plane is arranged at a region for ensuring a breakdown voltage. The hetero junction at the a-plane or the m-plane configures a gate portion along with a gate electrode. The electrons may be able to stay near the hetero junction plane of c-plane in a high density because an internal electric field in the hetero junction at the c-plane is strong. Therefore, when the hetero junction of c-plane is arranged at the region for ensuring the breakdown voltage, the increasing of the on-state resistance may be suppressed even if the region for ensuring the breakdown voltage is lengthened for improving the breakdown voltage. That is, by arranging the hetero junction of c-plane at the region for ensuring the breakdown voltage, the breakdown voltage may improve while the increase in the on-state resistance is suspended. Because the hetero junction at the a-plane or the m-plane has a characteristic feature of non-polarity, the semiconductor device may be able to switch between turn-on and turn-off mode. In this configuration, by selectively disposing the hetero junction of c-plane at the region for ensuring the breakdown voltage and selectively disposing the hetero junction of a-plane or m-plane at the region for switching the mode of the semiconductor device between turn-on and turn-off, the semiconductor devices that operates with the normally-off mode and has high breakdown voltage as well as low on-state resistance is provided.

The semiconductor device disclosed herein comprises a first hetero junction configured with two types of nitride semiconductors having different bandgap energy different from each other, and a second hetero junction configured with two types of nitride semiconductors having different bandgap energy from each other. The second hetero junction extends along a direction perpendicular to a direction along which the first hetero junction extends. The first hetero junction and the second hetero junction are configured to be electrically connected to each other. The semiconductor device further comprises a gate electrode that faces the second hetero junction. The first hetero junction is formed at the c-plane, and the second hetero junction is formed at either the a-plane or the m-plane.

According to the above described semiconductor device, electric current flows through the first hetero junction and the second hetero junction. The first hetero junction is provided at a region for ensuring breakdown voltage. The second hetero junction configures a gate portion along with the gate electrode. According to the above described semiconductor device, the electrons may stay near the junction plane of the first hetero junction in high density because the first hetero junction has a strong internal electric field intensity. Thus, increase of the on-state resistance may be suppressed even if the width of the region for ensuring the breakdown voltage is elongated in order for improving the breakdown voltage. The second hetero junction has a characteristic feature of non-polarity, and the semiconductor device may be able to operate with a normally-off mode. The above described semiconductor device may operate with the normally-off mode and have the high breakdown voltage as well as the low on-state resistance, by utilizing the two types of hetero junctions.

One semiconductor device realized by the teachings disclosed by the present application may have a drift portion and a gate portion which is in contact with the drift portion. The drift portion has a first hetero junction. The first hetero junction may include a first semiconductor region of one type of nitride semiconductor and a second semiconductor region of another type of nitride semiconductor, both of which may be in contact with each other. A bandgap energy of the second semiconductor region may be different from a bandgap energy of the first semiconductor region. The first semiconductor region and the second semiconductor region may configure the first hetero junction. The gate portion may have a second hetero junction and a gate electrode that faces the second hetero junction. The second hetero junction may include a third semiconductor region of the one type of nitride semiconductor and a fourth semiconductor region of another type of nitride semiconductor both of which are in contact with each other. A bandgap energy of the fourth semiconductor region may be different from a bandgap energy of the third semiconductor region. The third semiconductor region and the fourth semiconductor region may configure the second hetero junction. The first hetero junction and the second hetero junction may be configured able to be electrically connected to each other. The first hetero junction may be formed at the c-plane and the second hetero junction may be formed at either the a-plane or the m-plane.

According to the above described semiconductor device, the electric current may pass through the first hetero junction and the second hetero junction. The first hetero junction may be provided at the drift portion. The second hetero junction may be provided at the gate portion. The electrons may be able to stay near the junction plane of the first hetero junction in high density because the first hetero junction has a strong internal electric field intensity. Thus, increase in the on-state resistance may be suppressed even if the width of the drift portion is lengthened in order for improving the breakdown voltage. The second hetero junction has a characteristic feature of non-polarity, and the semiconductor device may be able to operate with the normally-off mode. That is, the above described semiconductor device may operate with the normally-off mode and have a high breakdown voltage as well as a low on-state resistance, by utilizing the two types of hetero junctions.

One semiconductor device realized by the teachings disclosed by the present application may comprise a drain region of one type of a nitride semiconductor, a drift portion disposed above the drain region, a gate portion disposed above a part of the drift portion, and a source region of one type of nitride semiconductor. The drain region contains impurities. The source region contains impurities and is disposed above another part of the drift portion. The drain region is electrically connected to a drain electrode. The source region is electrically connected to a source electrode. That is, this semiconductor device may be a vertical type semiconductor device in which the drain region and the source region are disposed separately along the vertical direction. The drift portion may comprise a first hetero junction. The first hetero junction may include a first semiconductor region of one type of a nitride semiconductor and a second semiconductor region of another type of nitride semiconductor, both of which are disposed within a range where the gate portion exists in a plan view. The first semiconductor region extends along a direction along which the drain region and the gate portion align. The second semiconductor region extends along the direction along which the drain region and the gate portion align and is in contact with the first semiconductor region. The second semiconductor region has a bandgap energy which is different from a bandgap energy of the first semiconductor region. The first semiconductor region and the second semiconductor region may configure the first hetero junction. The gate portion comprises the second hetero junction and a gate electrode which faces the second hetero junction. The second hetero junction may include a third semiconductor region of one type of nitride semiconductor and a fourth semiconductor region of another type of nitride semiconductor, both of which extends along a direction perpendicular to the direction along which the drain region and the gate portion align. The fourth semiconductor region is in contact with the third semiconductor region and has a bandgap energy which is different from a bandgap energy of the third semiconductor region. The third semiconductor region and the fourth semiconductor region may configure the second hetero junction. The first hetero junction and the second hetero junction are configured to be electrically connected to each other. The second hetero junction and the source region are also configured to be electrically connected to each other. The first hetero junction is formed at the c-plane and the second hetero junction is formed at either the a-plane or the m-plane.

According to the above described semiconductor device, carriers provided from the source region may flow to the drain region through the first hetero junction and the second hetero junction. By this semiconductor device, the first hetero junction is provided on the drift region selectively and the second hetero junction is provided on the gate portion selectively. Therefore, the semiconductor device may operate with the normally-off mode and have the high breakdown voltage as well as the low on-state resistance.

According to this semiconductor device, it is preferable that the drift portion further comprises a diffusion semiconductor layer and a third hetero junction. The diffusion semiconductor layer is disposed, in the plan view, at least within a range where the source region exists. The diffusion semiconductor layer contains impurities and is configured to be electrically connected to the source region via the second hetero junction and the first hetero junction. The third hetero junction may be disposed between the diffusion semiconductor layer and the drain region, and may be configured with two types of the nitride semiconductors having different bandgap energy different from each other. The third hetero junction is formed at the c-plane.

According to the semiconductor device, the on-state resistance may be further reduced because the semiconductor device utilizes an electric current that passes through the diffusion semiconductor layer and the third hetero junction in between the source region and the drain region.

On the semiconductor device disclosed by the present application, the first semiconductor region and the second semiconductor region may be repeatedly arranged, in the drift portion, at least along one direction.

According to the above embodiment, the on-state resistance may be further reduced because a plurality of electric current paths may be provided in the drift portion.

In the semiconductor device disclosed herein, the third semiconductor region may be configured with a part of the second semiconductor region. In this embodiment, the first semiconductor region and the second semiconductor region may be directly in contact with the fourth semiconductor region.

According to the above semiconductor device, the electric resistance between the first hetero junction and the second hetero junction may be reduced because the first hetero junction is directly in contact with the second hetero junction. According to the above described semiconductor device, the on-state resistance may be further reduced.

Furthermore, in the above described semiconductor device, the first semiconductor region and the fourth semiconductor region may be a same type of nitride semiconductor. In this case, the first semiconductor region and the fourth semiconductor region may be formed by a mutual crystal growth.

In the semiconductor device disclosed herein, preferably, each type of aforementioned nitride semiconductors may be $Al_XGa_YIn_{1-X-Y}N$ ($0 \leq X \leq 1, 0 \leq Y \leq 1, 0 \leq 1-X-Y \leq 1$).

The teachings disclosed herein provide a semiconductor device that operates with the normally-off mode and has high breakdown voltage as well as low on-state resistance, by selectively disposing the hetero junction of the c-plane to the region for ensuring the breakdown voltage and selectively disposing the hetero junction of the a-plane or the m-plane to the region for switching between turn-on and turn-off of the semiconductor device.

EMBODIMENTS OF THE INVENTION

With reference to the figures, an exemplary embodiment is described in detail below.

Figure 1:
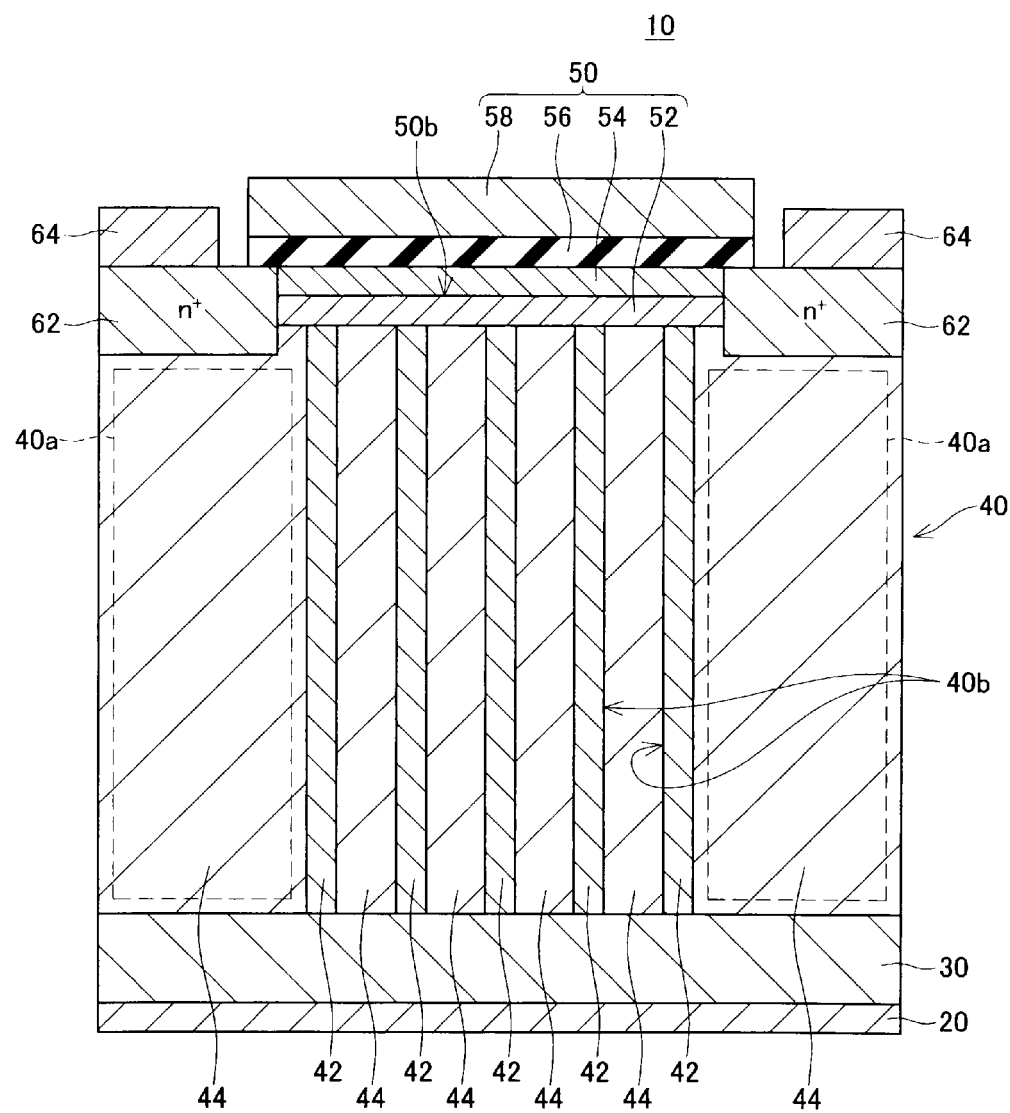
FIG. 1 shows a schematic cross sectional view of a primary part of the semiconductor device 10.

FIG. 1 shows a schematic cross sectional view of a primary part of the semiconductor device 10.

The semiconductor device 10 comprises a drain electrode 20 disposed on a rear surface of a semiconductor substrate and a source electrode 64 disposed on a front surface of the semiconductor substrate. The semiconductor device 10 has a vertical type structure in which electric current flows between the drain electrode 20 and the source electrode 64. A layered electrode constructed e.g. by titanium (Ti) and aluminum (Al) is used as a material of the drain electrode 20. Also, another layered electrode constructed e.g. with titanium (Ti) and aluminum (Al) is used as a material of the source electrode 64.

Furthermore, the semiconductor device 10 comprises a drain region 30 made of gallium nitride (GaN) disposed on the drain electrode 20. The drain region 30 contains n-type impurities (typically silicon) with high concentration and is electrically connected to the drain electrode 20.

The semiconductor device 10 further comprises a drift portion 40 disposed on the drain region 30, a gate portion 50 disposed on one part of the drift portion 40, and a source region 62 disposed on another part of the drift portion 40. The drift portion 40 is a region for ensuring the breakdown voltage of the semiconductor device 10. Thus, a thickness of the drift portion 40 may be appropriately determined based on a value of a breakdown voltage required for the semiconductor device 10. The gate portion 50 is a region for controlling on/off mode of the semiconductor device 10. The source region 62 is constructed by gallium nitride and aluminum gallium Nitride (AlGaN) as will be explained in manufacturing method below. The source region 62 contains n-type impurities (typically silicon) with high concentration and is electrically connected to the source electrode 64.

The drift portion 40 comprises first semiconductor regions 42 being made of aluminum gallium nitride and second semiconductor regions 44 being made of gallium nitride. The first semiconductor regions 42 and the second semiconductor regions 44 do not substantially contain any intentionally doped impurities. More specifically, the impurity concentrations in the first semiconductor regions 42 and the second semiconductor regions 44 are less than or equal to $1 \times 10^{16}$ cm$^{-3}$. The first semiconductor regions 42 extend along the direction along which the drain region 30 and the gate portion 50 align. The second semiconductor regions 44 also extend along the direction along which the drain region 30 and the gate portion 50 align. The first semiconductor regions 42 and the second semiconductor regions 44 are directly in contact with each other. In a plan view, the first semiconductor regions 42 and the second semiconductor regions 44 may be arranged in a stripes pattern, in a cross stripes pattern, or in a polygonal pattern, for example. In either of the cases, the first semiconductor region 42 and the second semiconductor region 44 are repeatedly arranged along at least one direction in the plan view.

The bandgap energy of aluminum gallium nitride is greater than the bandgap energy of gallium nitride. Therefore, the first semiconductor regions 42 and the second semiconductor regions 44 configure first hetero junctions 40b. In the plan view, the first hetero junctions 40b are disposed within a range where the gate portion 50 exists. On the other hand, the first hetero junctions 40b are not disposed within a range where the source region 62 exists in the plan view. That is, the first hetero junctions 40b are in contact with the gate portion 50 but not in contact with the source region 62. The first hetero junctions 40b are formed at a c-plane of a semiconductor crystal.

The gate portion 50 comprises a third semiconductor region 52 being made of gallium nitride and a fourth semiconductor region 54 being made of aluminum gallium nitride. The third semiconductor region 52 and the fourth semiconductor region 54 do not substantially contain any intentionally doped impurities. More specifically, impurity concentrations in the third semiconductor region 52 and the fourth semiconductor region 54 are less than or equal to $1 \times 10^{16}$ $cm^{-3}$. The third semiconductor region 52 extends along the direction perpendicular to the direction along which the drain region 30 and the gate portion 50 align. The fourth semiconductor region 54 also extends along the direction perpendicular to the direction along which the drain region 30 and the gate portion 50 align. The third semiconductor region 52 and the fourth semiconductor region 54 are directly in contact with each other. The third semiconductor region 52 and the fourth semiconductor region 54 are stacked. The third semiconductor region 52 and the fourth semiconductor region 54 extend along with the horizontal direction between the right and left source regions 62.

The bandgap energy of aluminum gallium nitride is greater than the bandgap energy of gallium nitride. Therefore, the third semiconductor region 52 and the fourth semiconductor region 54 configure a second hetero junction 50b. As will be described later, the second hetero junction 50b is able to electrically contact with the first hetero junctions 40b when the semiconductor device 10 turns on. The second hetero junction 50b is formed at an a-plane of the semiconductor crystal. It is noted that the second hetero junction 50b may alternately be formed at an m-plane of the semiconductor crystal.

The gate portion 50 further comprises a gate insulator film 56 and a gate electrode 58. The gate insulator film 56 and the gate electrode 58 are stacked on the surface of the fourth semiconductor region 54. The gate electrode 58 faces the second hetero junction 50b via the gate insulator film 56. The gate insulator film 56 and the gate electrode 58 are facing entire region of the second hetero junction 50b. An oxide silicon ($SiO_2$) is used for the gate insulator film 56. A polysilicon or an aluminum is used for the gate electrode 58. It is noted that the gate portion 50 may have a structure in which the gate electrode 58 and the fourth semiconductor region 54 configure a Schottky junction.

Figure 2:
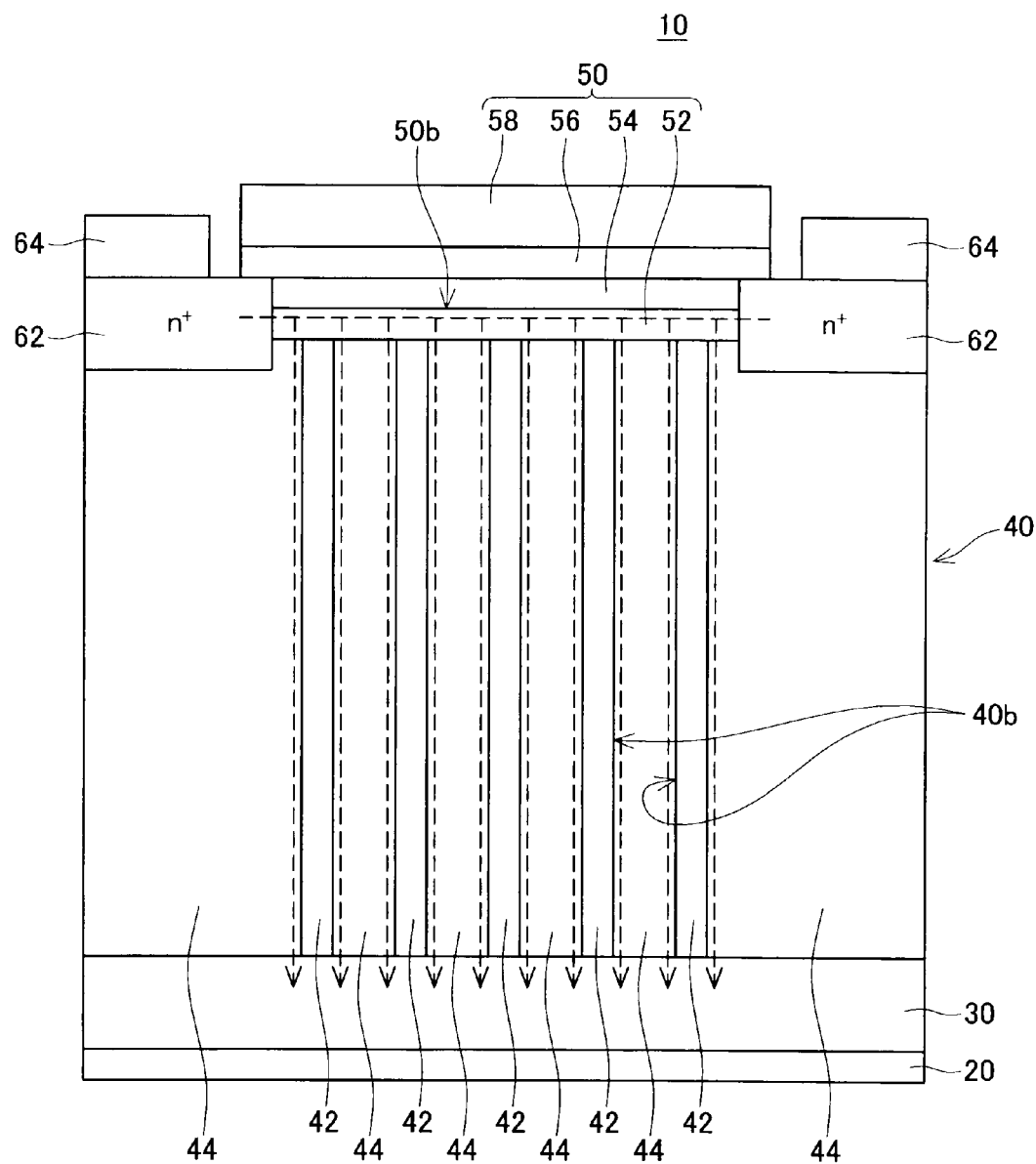
FIG. 2 shows an electric current path of the semiconductor device 10.

Next, operation of the semiconductor device 10 will be explained. FIG. 2 shows, by dashed lines, electric current paths in the semiconductor device 10. Note that hatchings are omitted in FIG. 2 in order to indicate the current paths clearly.

The semiconductor device 10 is characterized by utilizing two types of hetero junctions: the first hetero junctions 40b and the second hetero junction 50b. The first hetero junctions 40b are formed at the c-plane and the second hetero junction 50b is formed at either the a-plane or the m-plane. The first hetero junctions 40b are disposed in the drift portion 40 and the second hetero junction 50b is disposed in the gate portion 50.

First, a turn-off state of the semiconductor device 10 will be explained. When a positive voltage is applied to the drain electrode 20, the source electrode 64 is grounded and the gate electrode 58 is grounded, then the semiconductor device 10 will be in the turn-off state.

The second hetero junction 50b is formed at the a-plane and has a characteristic feature of non-polarity. Thus, an electron density near the second hetero junction 50b may be small. Therefore, a two-dimensional electron gas layer (2DEG layer) is not generated near the second hetero junction 50b, and electric current is not able to flow through the second hetero junction 50b. As a result, the source region 62 and the first hetero junction 40b will be electrically insulated and the source region 62 and the drain region 30 are not conductive therebetween. When the semiconductor device 10 turns off, no electrons and no holes may be available in the first semiconductor regions 42 and the second semiconductor regions 44. Therefore, the first semiconductor regions 42 and the second semiconductor regions 44, as a whole, behave substantially as an insulating material. As a result, the first semiconductor regions 42 and the second semiconductor regions 44 may sustain a voltage applied between the source region 62 and the drain region 30.

Next, a turn-on state of the semiconductor device 10 will be explained. When a positive voltage is applied to the drain electrode 20, the source electrode 64 is grounded and the positive voltage is applied to the gate electrode 58, then the semiconductor device 10 is in a turn-on state.

When a positive voltage is applied to the gate electrode 58, electric potential of the second hetero junction 50b will rise and the 2DEG layer will be generated near the second hetero junction 50b. As a result, the source region 62 and the first hetero junctions 40b are electrically connected with each other through the second hetero junction 50b; and the source region 62 and the drain region 30 become conductive therebetween. As shown in FIG. 2, when the semiconductor device 10 turns on, electrons supplied from the source region 62 flows to the drain region 30 through the second hetero junction 50b and the first hetero junctions 40b.

The semiconductor device 10 is characterized in that it utilizes the first hetero junctions 40b and the second hetero junction 50b. The first hetero junctions 40b formed at the c-plane are selectively disposed in the drift region 40, and the second hetero junction 50b formed at the a-plane or the m-plane is selectively disposed in the gate region 50.

The first hetero junctions 40b are formed at the c-plane, and strong internal electric fields are caused therein by its spontaneous polarization and piezoelectric polarization. For this reason, there may be a high electron density near the first hetero junctions 40b. Thus, the first hetero junctions 40b which extend across the drift portion 40 may provide low on-state resistance.

Therefore, the increase in the on-state resistance may be suppressed even if the drift portion 40 is thickened to improve the breakdown voltage.

The second hetero junction 50b is formed at one of the a-plane and the m-plane, so the direction of the internal electric field due to the spontaneous polarization and the piezoelectric polarization may be parallel to the second hetero junction 50b. For this reason, there may be a low electron density near the second hetero junctions 50b. Therefore, when the positive voltage is not applied to the gate electrode 58, the 2DEG layer may not be generated near the second hetero junction 50b. The semiconductor device 10 may operate with the normally-off mode (enhancement mode).

The semiconductor device 10 achieves a high breakdown voltage with a low on-state resistance by selectively disposing the first hetero junctions 40b at the c-plane in the drift portion 40 and also selectively disposing the second hetero junction 50b at the a-plane or the m-plane in the gate portion 50.

(A First Variant Semiconductor Device 11)

Figure 3:
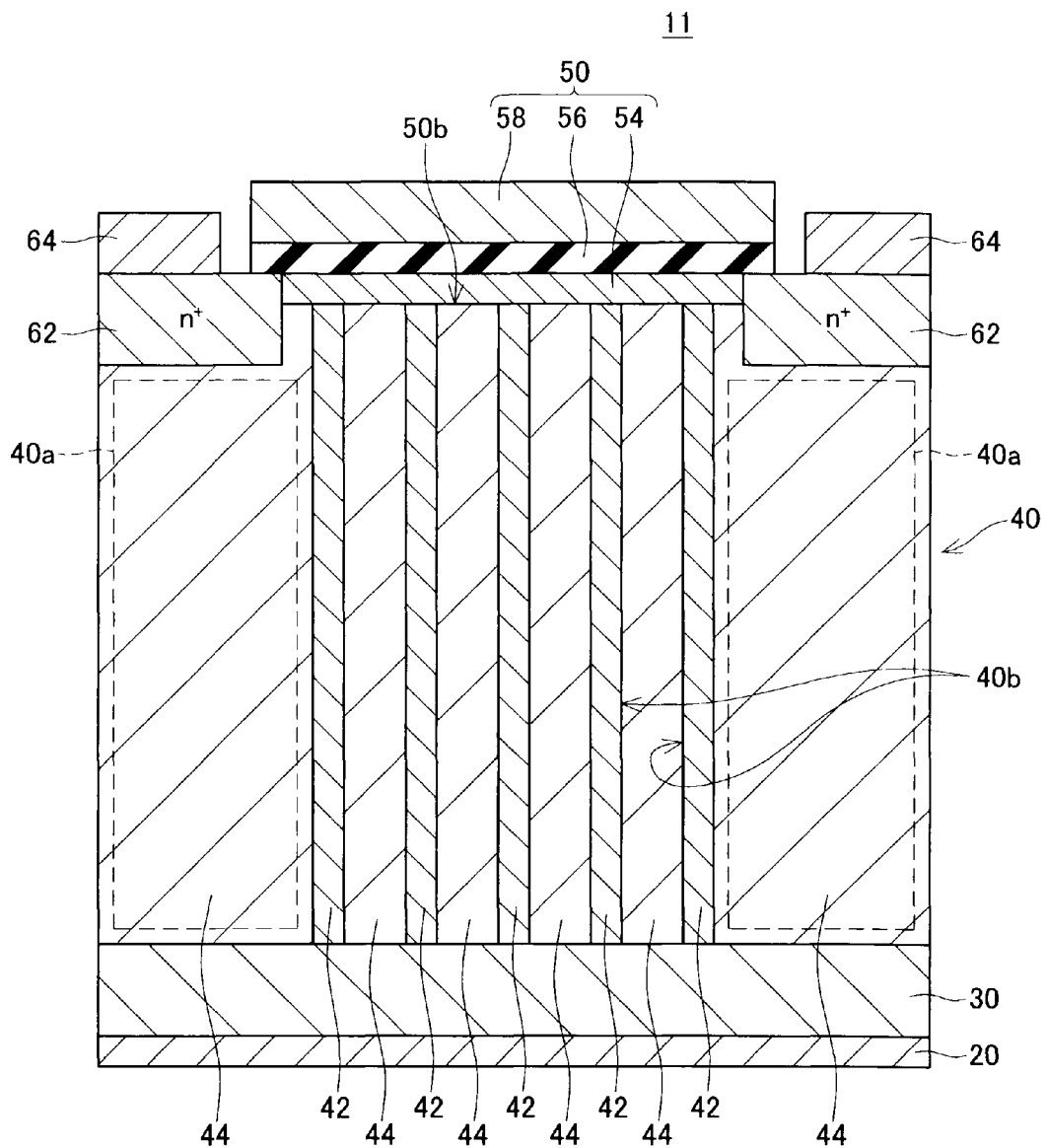
FIG. 3 shows a schematic cross sectional view of a primary part of the semiconductor device 11.

FIG. 3 shows a schematic cross sectional view of a primary part of the modified semiconductor device 11 which is a first variant of the semiconductor device 10. Note that elements behaving the same as the elements of the semiconductor device shown in FIG. 1 are denoted by the same numerals corresponding to those in FIG. 1, and explanation thereof will be omitted hereafter.

The semiconductor device 11 shown in FIG. 3 is characterized in that the third semiconductor region 52 is not provided as had been in the semiconductor device 10. Meanwhile, the semiconductor device 11 is characterized in that the first semiconductor regions 42 and the second semiconductor regions 44 are directly in contact with the fourth semiconductor region 54. In this case, the third semiconductor region may be deemed to be a part of the second semiconductor region 44. That is to say, a part of the second semiconductor region 44 that is in contact with the fourth semiconductor region 54 may act as the third semiconductor region. Therefore, the second hetero junction 50b is configured by the second semiconductor regions 44 and the fourth semiconductor region 54.

In the semiconductor device 11, the first hetero junctions 40b and the second hetero junction 50b are directly in contact with each other. Thus, when the semiconductor device 11 turns on, electric current paths where the electric current flows directly between the first hetero junctions 40b and the second hetero junction 50b may be formed. As a result, in the semiconductor device 11, the on-state resistance may be significantly reduced.

(A second Variant Semiconductor Device 12)

Figure 4:
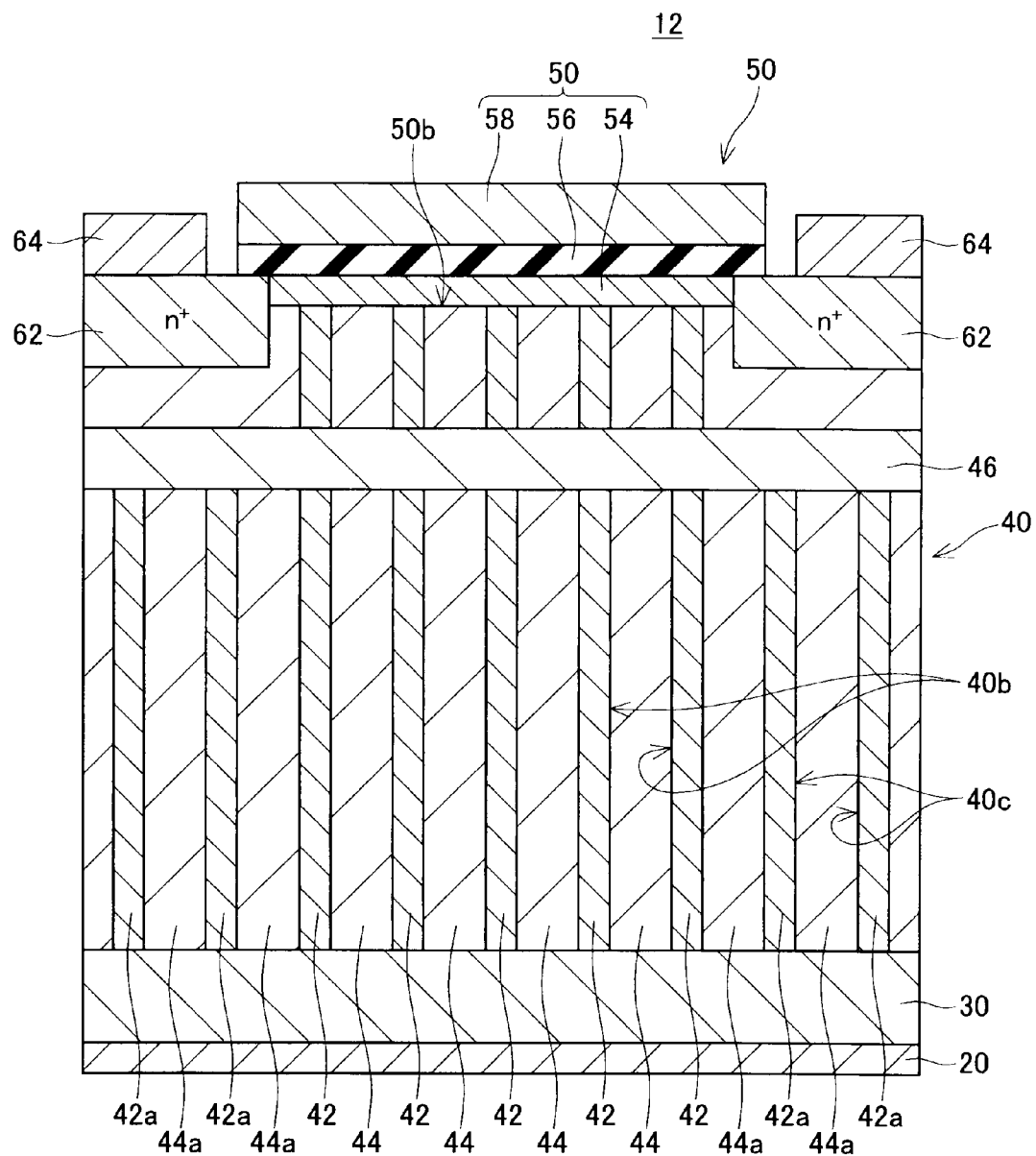
FIG. 4 shows a schematic cross sectional view of a primary part of the semiconductor device 12.

FIG. 4 shows a schematic cross sectional view of a primary part of another modified semiconductor device 12 which is a second variant of the semiconductor device 10. Note that elements behaving the same as the elements of the semiconductor device shown in FIG. 1 are denoted by numerals that are the same as the corresponding elements in FIG. 1, and explanation thereof will be omitted hereafter.

The semiconductor device 12 shown in FIG. 4 is characterized in that the drift region 40 further comprises a diffusion semiconductor layer 46 and third hetero junctions 40c. The third hetero junctions 40c are formed at the c-plane.

The diffusion semiconductor layer 46 extends in the drift portion 40 along a lateral direction. The diffusion semiconductor layer 46 is made of gallium nitride and contains n-type impurities (typically silicon) in high concentration. The diffusion semiconductor layer 46 is not electrically connected to the source region 62 directly. The diffusion semiconductor layer 46 is electrically connected to the source region 62 indirectly via the second hetero junction 50b and the first hetero junctions 40b.

The third hetero junctions 40c are disposed between the semiconductor layer 46 and the drain region 30. In the plan view, the third hetero junctions 40c are disposed within a range where the source region 62 exists. Substantially, each of the third hetero junctions 40c has a common configuration with the first hetero junction 40b. The third hetero junction 40c differ from the first hetero junction 40b in terms of an arrangement in which the third hetero junction 40c is disposed, in a plan view, below the source region 62. As described later, the first hetero junctions 40b and the third hetero junctions 40c may be formed by common manufacturing method. Thus, a semiconductor region indicated by numeral 42a which constitutes the third hetero junction 40c has a common configuration with the first semiconductor region 42. Also, a semiconductor region indicated by numeral 44a which constitutes the third hetero junction 40c has a common configuration with the second semiconductor region 44.

Figure 5:
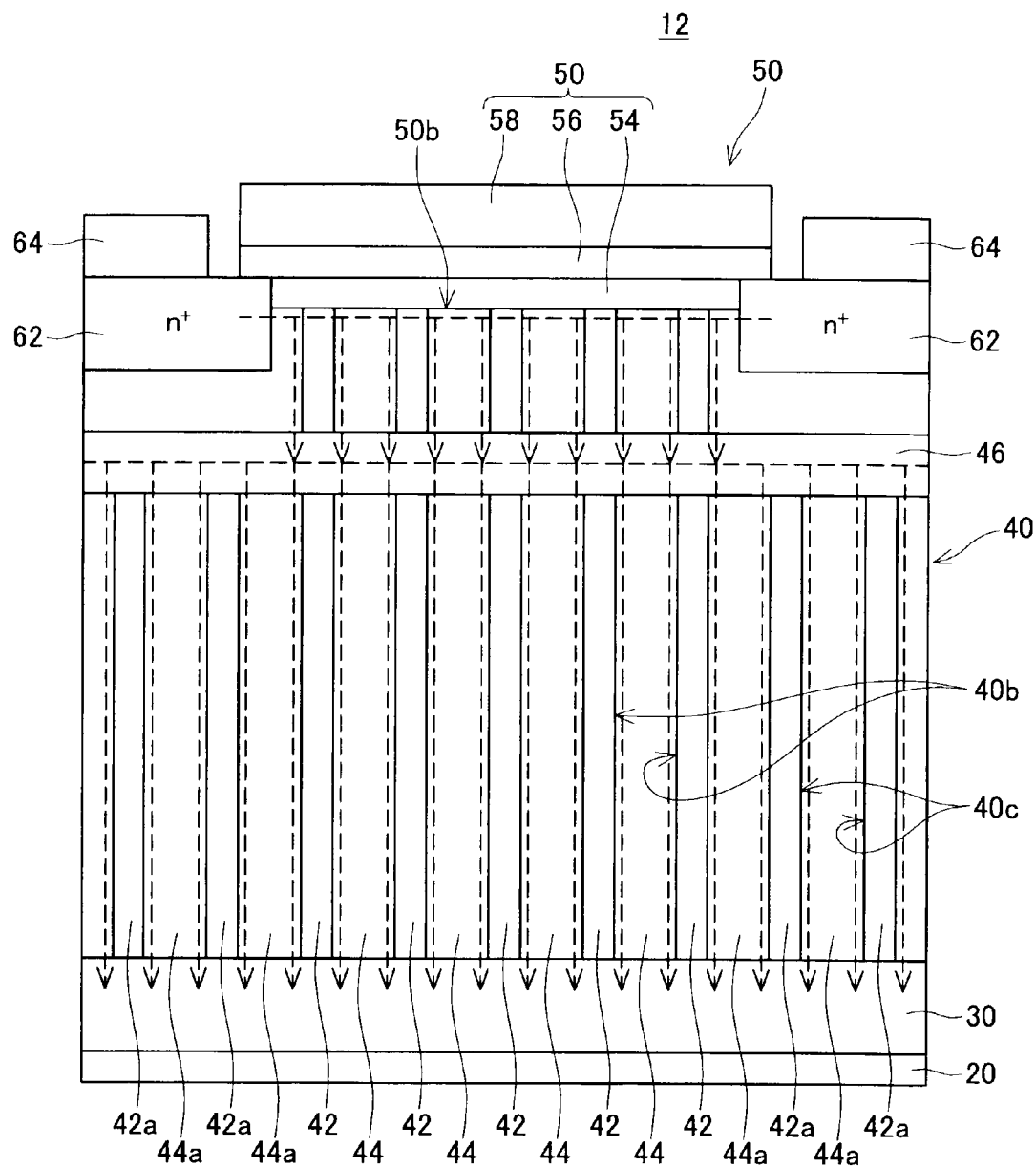
FIG. 5 shows an electric current path of the semiconductor device 12.

Next, an operation of the semiconductor device 12 will be explained. FIG. 5 shows electric current paths in the semiconductor device 12 by dashed lines. Note that the hatchings are omitted in FIG. 5 for clearer indication of the current paths.

It will be explained with reference to the semiconductor device in FIG. 1 for comparison. As shown in FIG. 1, in the semiconductor device 10, there exists a space 40a which does not contribute as one of the electric current paths between the source region 62 and the drain region 30.

On the other hand, in the semiconductor device 12 shown in FIG. 4, the diffusion semiconductor layer 46 and the third hetero junctions 40c are arranged in a region corresponding to the space 40a. As shown in FIG. 5, the diffusion semiconductor layer 46 and the third hetero junctions 40c may be able to contribute as electric current paths when the semiconductor device 12 turns on. That is, in the semiconductor device 12, after spreading along the lateral direction in the horizontal plane through the diffusion semiconductor layer 46, the electric current may be able to flow at the region corresponding to the space 40a, along the vertical direction, to the drain region 30 through the third hetero junctions 40c. According to the semiconductor device 12, the on-state resistance may be further reduced because the electric current paths through the diffusion semiconductor layer 46 and the third hetero junctions 40c may be added between the source region 62 and the drain region 30.

(A Manufacturing Method for the Semiconductor Device 12)

A manufacturing method for the semiconductor device 12 will be described with reference to FIG. 6 to FIG. 13 hereinafter. A part of the manufacturing method described below may be employed for manufacturing the semiconductor device 10 shown in FIG. 1 and the semiconductor device 11 shown in FIG. 3.

Figure 6:
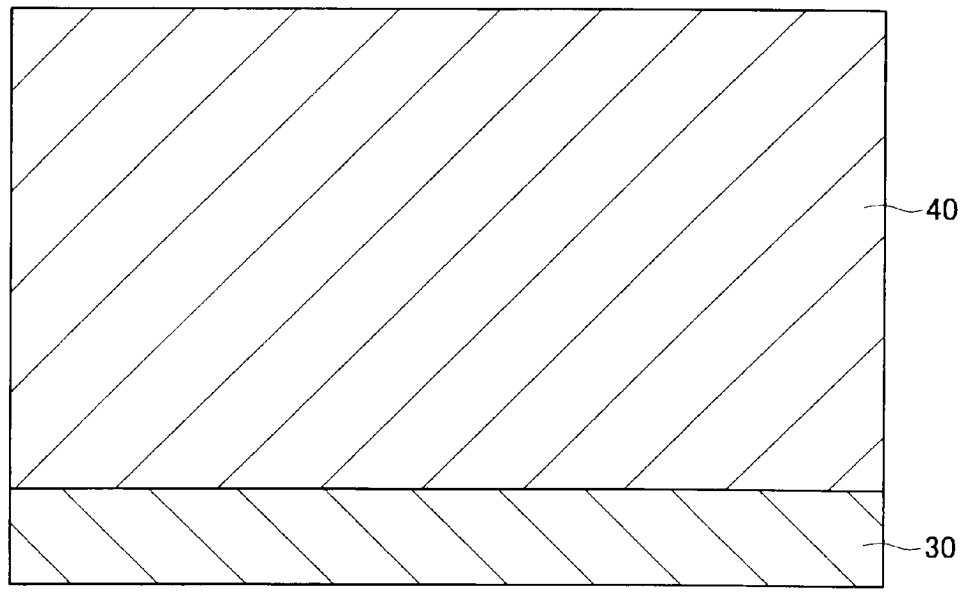
FIG. 6 shows a first step of manufacturing the semiconductor device 12.

First, as shown in FIG. 6, a structure in which a semiconductor substrate 30 being made of gallium nitride (it will be the drain region 30 in the end) and a drift layer 40 being made of gallium nitride (it will be the drift portion 40 in the end) are stacked may be provided. The semiconductor substrate 30 contains n-type impurities (typically silicon) and the surface of the semiconductor substrate 30 corresponds to either the a-plane or the m-plane. The drift layer 40 is either an i-type or a n-type. This structure may be provided by forming the drift layer 40 by growing a crystal from the surface of the semiconductor substrate 30 using e.g. MOCVD (Metal Organic Chemical Vapor Deposition) method. The thickness of the drift layer 40 may be appropriately determined based on a value of the breakdown voltage required for the semiconductor device 12.

Figure 7:
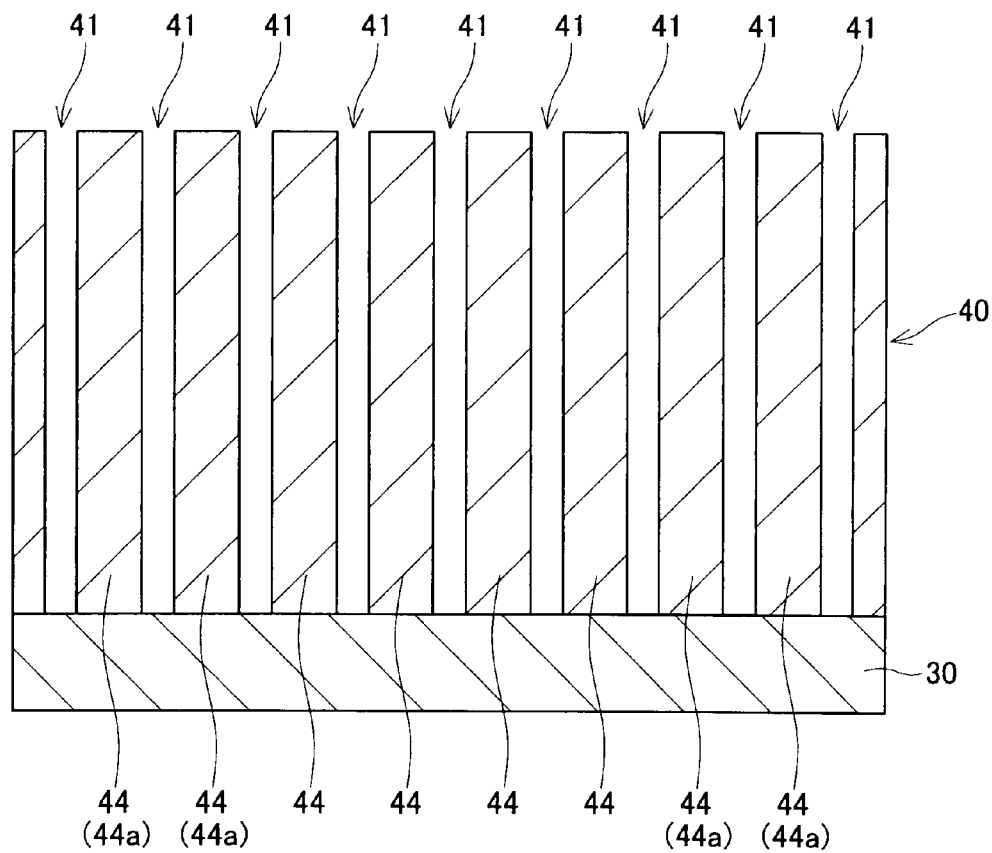
FIG. 7 shows a second step of manufacturing the semiconductor device 12.

Next, as shown in FIG. 7, trenches 41 that penetrate the drift layer 40 and reach the semiconductor substrate 30 are formed by a lithography technique and an anisotropic etching technique. The trenches 41 are arranged, for example, in a stripe pattern in the plan view. The c-planes are exposed at the side surfaces of the trenches 41. Remaining portions between the trenches 41 are the second semiconductor regions 44.

Figure 8:
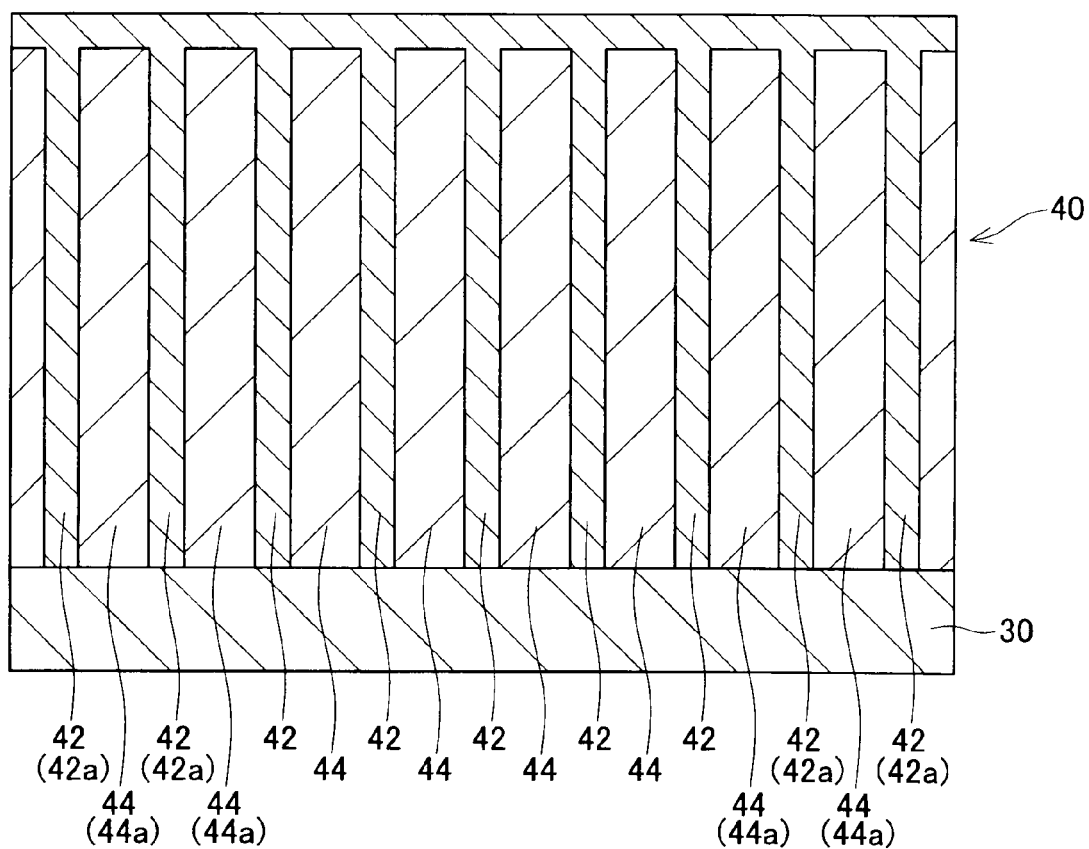
FIG. 8 shows a third step of manufacturing the semiconductor device 12.

Next, as shown in FIG. 8, by employing MOCVD, the trenches 41 are filled with the first semiconductor regions 42 being made of aluminum gallium nitride. Note that, instead of filling the trenches 41 only with the first semiconductor regions 42, a portion of each trench 41 may be filled with the first semiconductor regions 42 first, and then semiconductor regions of gallium nitride may be crystal-grown by MOCVD until the remaining of the trench 41 is filled completely.

Figure 9:
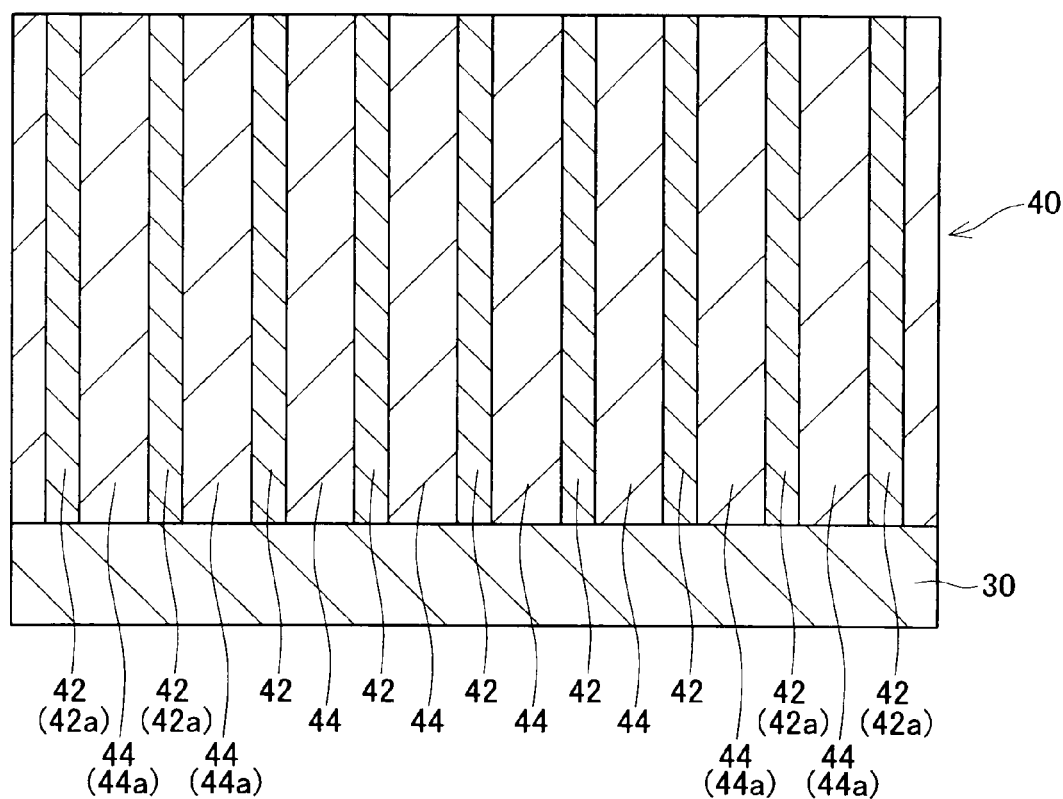
FIG. 9 shows a fourth step of manufacturing the semiconductor device 12.

Next, as shown in FIG. 9, the first semiconductor region 42 which covers the surface may be removed by employing an ICP (Inductively Coupled Plasma) etching technique. Through the above mentioned steps, a structure in which the first semiconductor regions 42 and the second semiconductor regions 44 are repeatedly arranged in the drift layer 40 along one direction may be obtained.

Figure 10:
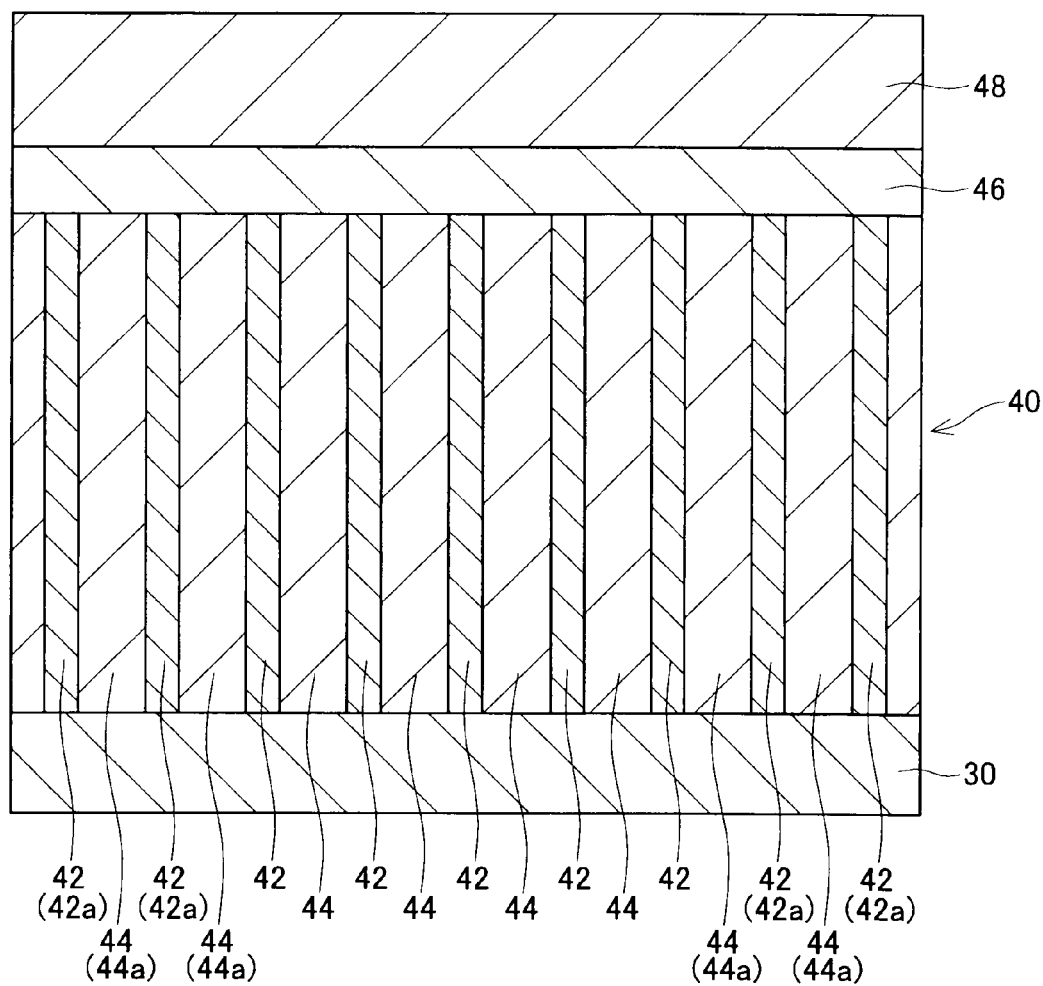
FIG. 10 shows a fifth step of manufacturing the semiconductor device 12.

Next, as shown in FIG. 10, by employing MOCVD, the diffusion semiconductor layer 46 of gallium nitride and the upper side drift layer 48 of gallium nitride (which will be a part of the drift portion 40 in the end) may be crystal-grown from the surface of the drift layer 40. The diffusion semiconductor layer 46 contains n-type impurities in high concentration. The upper side drift layer 48 is i-type, and does not contain any intentionally doped impurities.

Figure 11:
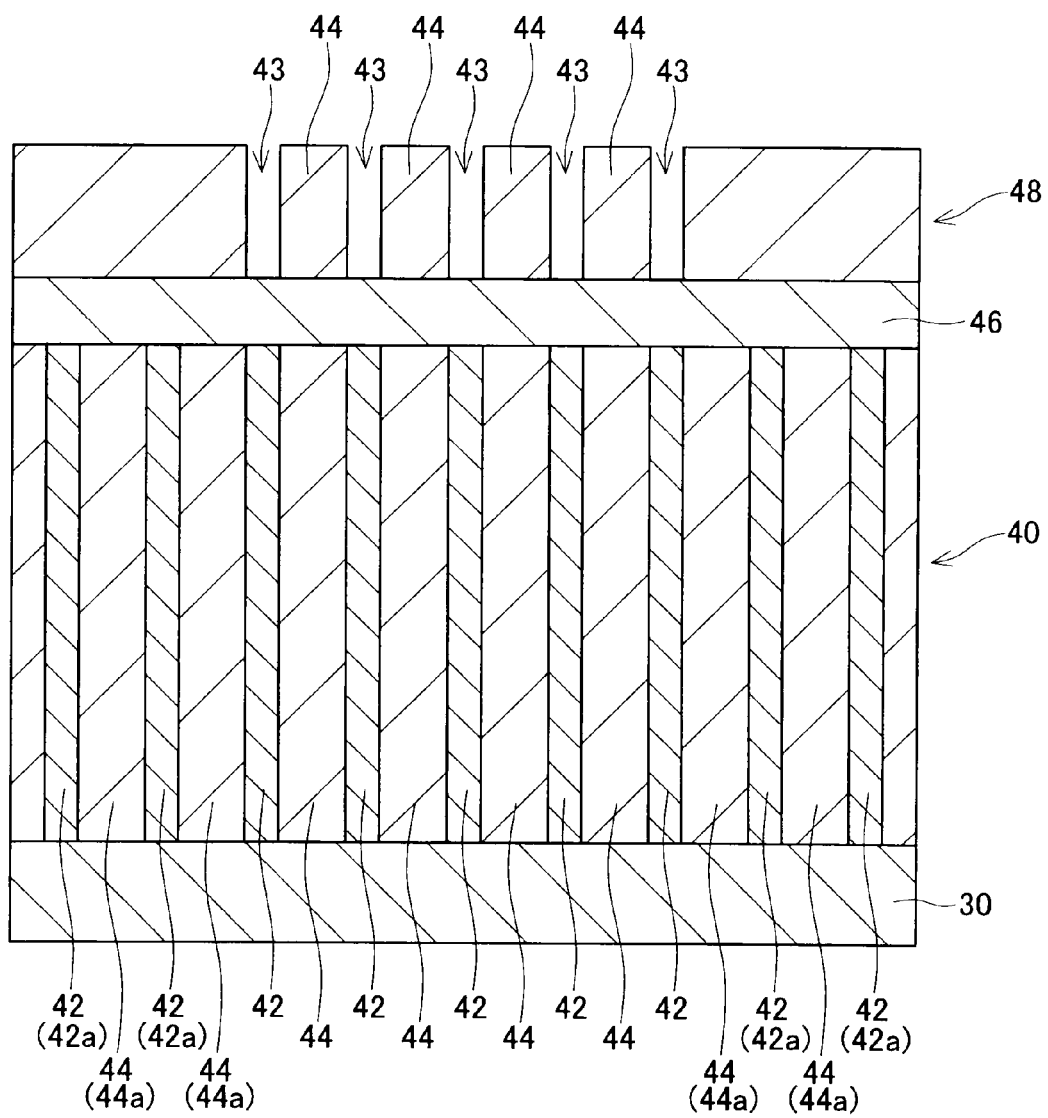
FIG. 11 shows a sixth step of manufacturing the semiconductor device 12.

Next, as shown in FIG. 11, trenches 43 that penetrate the upper drift layer 48 and reach the diffusion semiconductor layer 46 may be formed by employing the lithography technique and the anisotropic etching technique. The trenches 43 are arranged, for example, in a stripe pattern in the plan view. The c-planes are exposed at the side surfaces of the trenches 43. A range in which the trenches 43 are formed is positioned within a range in which the second semiconductor regions 44 and the first semiconductor regions 42 exist in the drift region 40. In this embodiment, in the plan view, the trenches 43 are co-located with some of the first semiconductor regions 42. This arrangement may not be particularly important. Alternately, the trenches 43 may not be co-located with the first semiconductor regions 42. The remaining portions between the trenches 43 may become the second semiconductor regions 44.

Figure 12:
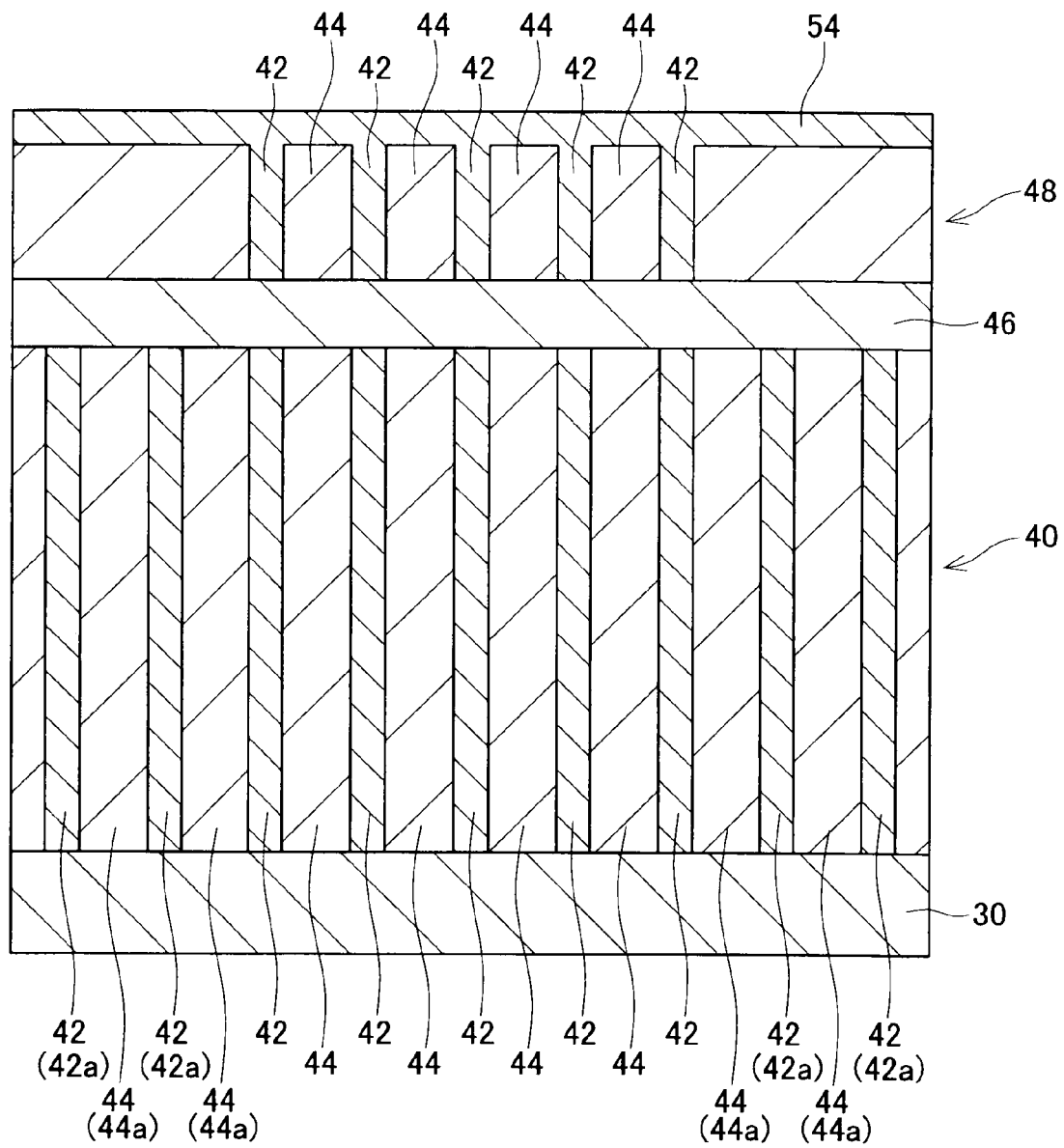
FIG. 12 shows a seventh step of manufacturing the semiconductor device 12.

Next, as shown in FIG. 12, by employing MOCVD, the trenches 43 may be filled with the first semiconductor regions 42 of aluminum gallium nitride. At this time, aluminum gallium nitride may be provided until it covers the surface of the upper drift layer 48. A portion of aluminum gallium nitride which covers the surface of the upper drift layer 48 may become the fourth semiconductor region 54. It is noted that, instead of filling each trench 43 only with the first semiconductor region 42, a portion of the trench 43 may be filled with the first semiconductor region 42 first, and then semiconductor region of gallium nitride may be crystal-grown by MOCVD until the remaining portion of the trench 43 is filled completely. In this case, the fourth semiconductor region 54 being made of aluminum gallium nitride may be formed on the surface of the upper drift layer 48 after filling the trenches 43 with semiconductor regions of gallium nitride.

Figure 13:
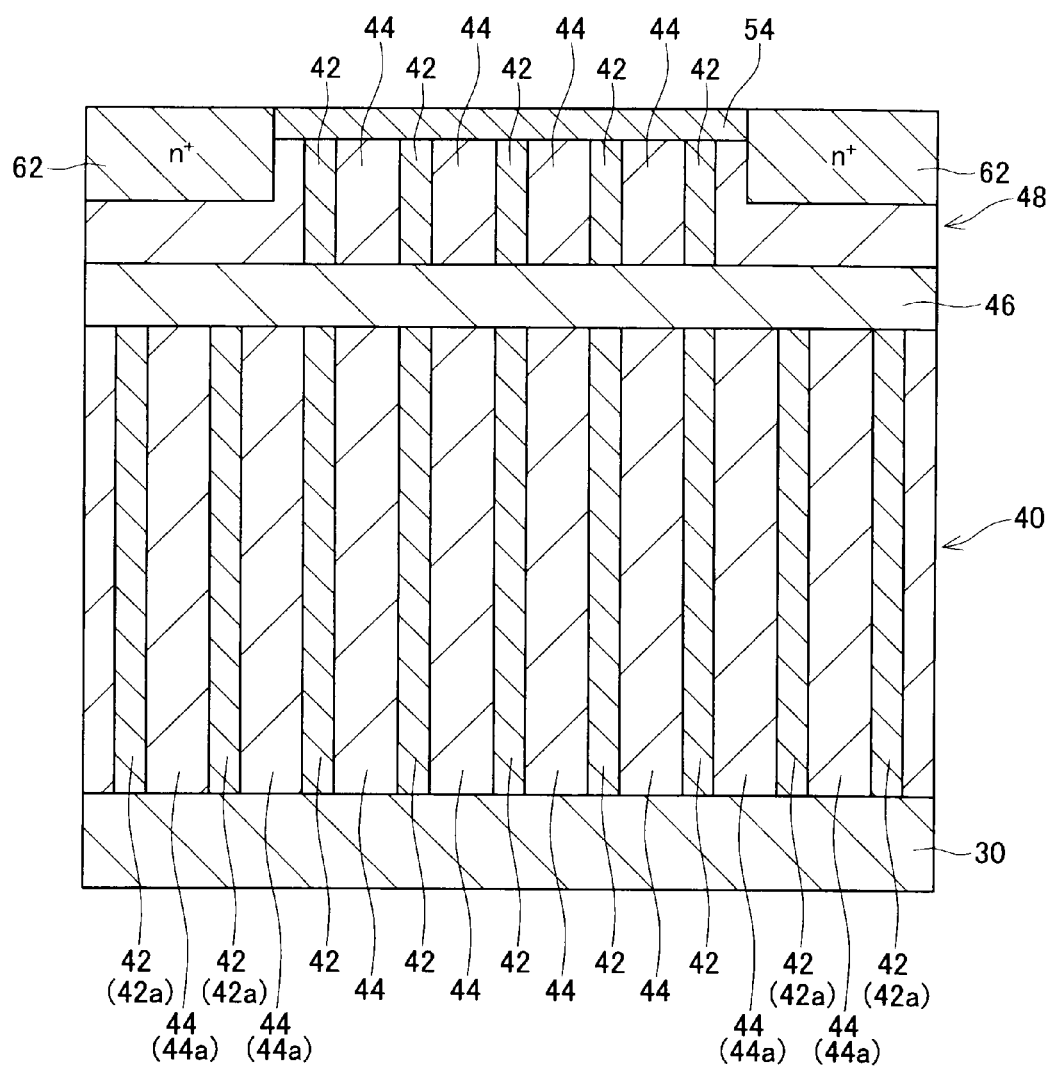
FIG. 13 shows an eighth step of manufacturing the semiconductor device 12.

Next, as shown in FIG. 13, the source region 62 may be formed by implanting silicon from a part of the surface of the fourth semiconductor region 54 into a part of the upper drift layer 48 by employing an ion implantation technique.

After that, the gate insulator film 56, the gate electrode 58, and the drain electrode 20 and the like may be formed. Then, the semiconductor device 12 shown in FIG. 4 may be obtained.

Specific embodiments of the present teachings are described above, but these merely illustrate some possibilities of the teachings and do not restrict the scope of the claims. The art set forth in the claims includes variations and modifications of the specific examples set forth above.

Further, the technical elements disclosed in the specification or the drawings may be utilized separately or in all types of combinations, and are not limited to the combinations set forth in the claims at the time of filing of the application.

Furthermore, the technology illustrated in the present specification or the drawings may simultaneously achieve a plurality of objects, and has technological utility by achieving one of those objects.

The invention claimed is:

1. A semiconductor device comprising:
a drain region of one type of nitride semiconductor, the drain region including impurities and being electrically connected to a drain electrode;
a drift portion placed above the drain region;
a gate portion placed above a part of the drift portion; and
a source region of one type of nitride semiconductor, the source region including impurities, being placed above another part of the drift portion and being electrically connected to a source electrode,
wherein the drift portion comprises a first hetero junction, the first hetero junction including:
a first semiconductor region of one type of nitride semiconductor and a second semiconductor region of another type of nitride semiconductor which are in contact with each other, wherein:
the first semiconductor region is placed within a range where the gate portion exists in a plan view and extends along a direction along which the drain region and the gate portion align,
the second semiconductor region is placed within the range where the gate portion exists in the plan view and extends along the direction along which the drain region and the gate portion align, and
a bandgap energy of the second semiconductor region is different from a bandgap energy of the first semiconductor region,
the gate portion comprises a second hetero junction and a gate electrode facing the second hetero junction, the second hetero junction including:
a third semiconductor region of one type of nitride semiconductor and a fourth semiconductor region of another type of nitride semiconductor which are in contact with each other, wherein:
the third semiconductor region extends along a direction perpendicular to the direction along which the drain region and the gate portion align,
the fourth semiconductor region extends along a direction perpendicular to the direction along which the drain region and the gate portion align, and
a bandgap energy of the fourth semiconductor region is different from a bandgap energy of the third semiconductor region,
the first hetero junction and the second hetero junction are configured to be electrically connected to each other,
the second hetero junction is configured to be electrically connected to the source region,
the first hetero junction is formed at a c-plane, and
the second hetero junction is formed at an a-plane or an m-plane.

2. The semiconductor device according to claim 1, wherein the drift portion further comprises a diffusion semiconductor layer and a third hetero junction,
the diffusion semiconductor layer includes impurities, is placed at least within a range where the source region exists in the plan view and is configured to be electrically connected to the source region via the second hetero junction and the first hetero junction,
the third hetero junction is placed between the diffusion semiconductor layer and the drain region, and is configured with two types of nitride semiconductors having different bandgap energy from each other, and
the third hetero junction is formed at the c-plane.

3. The semiconductor device according to claim 2, wherein
the first semiconductor region and the second semiconductor region are repeatedly placed at least along one direction in the drift portion.

4. The semiconductor device according to claim 3, wherein
the third semiconductor region is configured with a part of the second semiconductor region, and
the first semiconductor region and the second semiconductor region are directly in contact with the fourth semiconductor region.

5. The semiconductor device according to claim 4, wherein
each type of nitride semiconductor is $Al_XGa_YIn_{1-X-Y}N$ ($0 \leq X \leq 1$, $0 \leq Y \leq 1$, $0 \leq 1-X-Y \leq 1$).

6. The semiconductor device according to claim 3, wherein
each type of nitride semiconductor is $Al_XGa_YIn_{1-X-Y}N$ ($0 \leq X \leq 1$, $0 \leq Y \leq 1$, $0 \leq 1-X-Y \leq 1$).

7. The semiconductor device according to claim 2, wherein
the third semiconductor region is configured with a part of the second semiconductor region, and
the first semiconductor region and the second semiconductor region are directly in contact with the fourth semiconductor region.

8. The semiconductor device according to claim 7, wherein
each type of nitride semiconductor is $Al_XGa_YIn_{1-X-Y}N$ ($0 \leq X \leq 1$, $0 \leq Y \leq 1$, $0 \leq 1-X-Y \leq 1$).

9. The semiconductor device according to claim 2, wherein
each type of nitride semiconductor is $Al_XGa_YIn_{1-X-Y}N$ ($0 \leq X \leq 1$, $0 \leq Y \leq 1$, $0 \leq 1-X-Y \leq 1$).

10. The semiconductor device according to claim 1, wherein
the first semiconductor region and the second semiconductor region are repeatedly placed at least along one direction in the drift portion.

11. The semiconductor device according to claim 10, wherein
the third semiconductor region is configured with a part of the second semiconductor region, and
the first semiconductor region and the second semiconductor region are directly in contact with the fourth semiconductor region.

12. The semiconductor device according to claim 11, wherein
each type of nitride semiconductor is $Al_XGa_YIn_{1-X-Y}N$ ($0 \leq X \leq 1$, $0 \leq Y \leq 1$, $0 \leq 1-X-Y \leq 1$).

13. The semiconductor device according to claim 10, wherein
each type of nitride semiconductor is $Al_XGa_YIn_{1-X-Y}N$ ($0 \leq X \leq 1$, $0 \leq Y \leq 1$, $0 \leq 1-X-Y \leq 1$).

14. The semiconductor device according to claim 1, wherein
the third semiconductor region is configured with a part of the second semiconductor region, and
the first semiconductor region and the second semiconductor region are directly in contact with the fourth semiconductor region.

15. The semiconductor device according to claim 14, wherein
the first semiconductor region and the fourth semiconductor region are a same type of nitride semiconductor.

16. The semiconductor device according to claim 15, wherein
each type of nitride semiconductor is $Al_XGa_YIn_{1-X-Y}N$ ($0 \leq X \leq 1$, $0 \leq Y \leq 1$, $0 \leq 1-X-Y \leq 1$).

17. The semiconductor device according to claim 14, wherein
each type of nitride semiconductor is $Al_XGa_YIn_{1-X-Y}N$ ($0 \leq X \leq 1$, $0 \leq Y \leq 1$, $0 \leq 1-X-Y \leq 1$).

18. The semiconductor device according to claim 1, wherein
each type of nitride semiconductor is $Al_XGa_YIn_{1-X-Y}N$ ($0 \leq X \leq 1$, $0 \leq Y \leq 1$, $0 \leq 1-X-Y \leq 1$).

* * * * *